United States Patent
Song et al.

(10) Patent No.: US 7,917,175 B2
(45) Date of Patent: Mar. 29, 2011

(54) DEVICE AND METHOD FOR REMOTELY MEASURING AND MONITORING ANTENNA SYSTEM USING MOBILE TERMINAL

(75) Inventors: Jae-Sub Song, Seoul (KR); Jin-Ho Choi, Gyeonggi-do (KR); Jae-Kon Kim, Seoul (KR); Jung-Ho Lee, Seoul (KR)

(73) Assignee: KT Corporation, Seongnam (KR)

( * ) Notice: Subject to any disclaimer, the term of this patent is extended or adjusted under 35 U.S.C. 154(b) by 665 days.

(21) Appl. No.: 10/586,106

(22) PCT Filed: Jan. 14, 2005

(86) PCT No.: PCT/KR2005/000129
§ 371 (c)(1),
(2), (4) Date: Oct. 19, 2007

(87) PCT Pub. No.: WO2005/069664
PCT Pub. Date: Jul. 28, 2005

(65) Prior Publication Data
US 2008/0102897 A1    May 1, 2008

(30) Foreign Application Priority Data

Jan. 16, 2004 (KR) .................. 10-2004-0003214

(51) Int. Cl.
*H04M 1/00*        (2006.01)
(52) U.S. Cl. .................. 455/561; 455/562.1; 455/575.7
(58) Field of Classification Search .................. 455/561, 455/562.1, 566, 575.7, 67.11
See application file for complete search history.

(56) References Cited

U.S. PATENT DOCUMENTS

| | | | | | |
|---|---|---|---|---|---|
| 4,584,650 | A | * | 4/1986 | Kozuch | 702/64 |
| 4,964,065 | A | * | 10/1990 | Hicks et al. | 709/226 |
| 5,548,820 | A | * | 8/1996 | Victorin | 455/67.14 |
| 5,752,164 | A | * | 5/1998 | Jones | 455/454 |
| 6,029,051 | A | * | 2/2000 | Osterberg et al. | 455/115.1 |
| 6,055,418 | A | * | 4/2000 | Harris et al. | 455/91 |
| 6,151,482 | A | * | 11/2000 | Eriksson | 455/67.11 |

(Continued)

FOREIGN PATENT DOCUMENTS

GB    2 354 115 A    3/2001

(Continued)

OTHER PUBLICATIONS

PCT/KR2005/000129 International Search Report, Apr. 5, 2005.

*Primary Examiner* — Dominic E Rego
(74) *Attorney, Agent, or Firm* — Alston & Bird LLP

(57) ABSTRACT

An antenna system measurer for a repeater and a base station measures powers of a progressive wave and a reflected wave of a transmit/receive antenna, and transmits measured results to a monitoring server in a radio data format such as an SMS message. The monitoring server receives the radio data, identifies a repeater and a base station from sender information of the radio data, and calculates a VSWR based on the measured values. The VSWR is modified based on characteristics of the base station such as length and substance of feeders from a base station identifier corresponding to the sender information. According to the present invention, the remote antenna system is monitored in real-time without visits or installation fees, and a plurality of repeaters and base stations is managed in a combined manner.

8 Claims, 7 Drawing Sheets

U.S. PATENT DOCUMENTS

| | | | |
|---|---|---|---|
| 6,289,216 B1* | 9/2001 | Koh et al. | 455/424 |
| 6,505,041 B1* | 1/2003 | Borgstrand | 455/423 |
| 6,577,860 B1* | 6/2003 | Yoshida | 455/412.1 |
| 6,640,115 B1* | 10/2003 | Fujimoto et al. | 455/567 |
| 6,668,160 B2* | 12/2003 | Schmitt et al. | 455/67.14 |
| 6,741,640 B1* | 5/2004 | Johnson | 375/219 |
| 6,747,956 B1* | 6/2004 | Darack et al. | 370/252 |
| 6,980,782 B1* | 12/2005 | Braun et al. | 455/277.2 |
| 7,053,631 B2* | 5/2006 | Weese | 324/646 |
| 7,127,220 B2* | 10/2006 | Abrams et al. | 455/127.5 |
| 7,158,820 B2* | 1/2007 | Suzuki et al. | 455/575.7 |
| 7,493,129 B1* | 2/2009 | Mostafa et al. | 455/502 |
| 2002/0033776 A1* | 3/2002 | Kallina | 343/711 |
| 2003/0162539 A1* | 8/2003 | Fiut et al. | 455/424 |
| 2004/0127261 A1* | 7/2004 | Endress | 455/562.1 |
| 2004/0132497 A1* | 7/2004 | Weese | 455/562.1 |
| 2004/0137950 A1* | 7/2004 | Bolin et al. | 455/562.1 |
| 2004/0214608 A1* | 10/2004 | Mostafa et al. | 455/562.1 |
| 2008/0267056 A1* | 10/2008 | Aryanfar et al. | 370/203 |

FOREIGN PATENT DOCUMENTS

| | | |
|---|---|---|
| JP | 61-097059 | 5/1986 |
| JP | 63-026129 | 2/1988 |
| JP | 07-099068 | 4/1995 |
| JP | 2000-263803 | 9/2000 |
| JP | 2001-024600 | 1/2001 |
| JP | 2001-320754 | 11/2001 |
| JP | 2002-527932 | 8/2002 |
| JP | 2002-344397 | 11/2002 |
| JP | 2003-060766 | 2/2003 |
| WO | WO 00/21226 | 4/2000 |

* cited by examiner

DEVICE AND METHOD FOR REMOTELY MEASURING AND MONITORING ANTENNA SYSTEM USING MOBILE TERMINAL

TECHNICAL FIELD

The present invention relates to a device and method for remotely measuring and monitoring an antenna system of a repeater or a base station. More specifically, the present invention relates to a system and method for measuring and monitoring the antenna of a remote repeater or base station without directly testing the antenna.

BACKGROUND ART

A base station or a repeater has an antenna for transmission and reception, and one test point for measuring the performance of the antenna is the voltage standing-wave ratio (VSWR).

The VSWR represents a voltage ratio measured from an adjacent node and amplitude within a cable or a waveguide having a standing wave, or the VSWR denotes the ratio of maximum to minimum voltage in a standing wave pattern in a transmission line.

For example, a progressive wave is divided into a progressive wave and a reflected wave on two media with two different kinds of impedance because of impedance mismatch, and the difference between the two waves represents the VSWR which is defined in Math FIG. 1 when the reflection coefficient is given to be p.

$$VSWR = \frac{1 + |\rho|}{1 - |\rho|} \qquad \text{Math Figure 1}$$

That is, a VSWR of 1 represents that line impedance and end impedance are completely matched and incident waves are passed through the media, and the VSWR is an important factor for checking the antenna operation status since the greater the VSWR becomes the more incident waves are reflected therefrom.

FIG. 1 shows a conventional VSWR measuring system.

As shown, a base station 10 has a diversity antenna for receiving and identifying signals which are transmitted through various spatial and temporal paths of radio frequency (RF) propagation between a base station and an antenna, and improving received characteristics. The base station 10 includes a transmission and receiving circuit 11, a diversity receiving circuit 16, a first antenna 15, and a second antenna 19. The first antenna 15 is used to transmit and receive signals and the second antenna 19 is used to receive signals. For ease of description, the first antenna 15 is established to be a transmit antenna and the second antenna 19 is established to be a receive antenna. A process for measuring the respective transmission and receiving VSWRs will now be described.

A transmitter (not illustrated) of the transmission and receiving circuit 11 outputs transmission signals to the first antenna 15 through a high power amplifier 13, and a receiver (not illustrated) thereof receives signals through a low noise amplifier 14. A duplexer 12 connects a transmission circuit and a receiving circuit so that the first antenna 15 may be used for transmitting and receiving signals.

A receiving circuit 16 includes a band-pass filter 18 for selecting a desired channel from the RF signals received from the second antenna, and a low noise amplifier 17.

A conventional VSWR measuring system includes a transmitted VSWR measurer 30, a received VSWR measurer 40, and directional couplers 21 and 22. The directional couplers 21 and 22 are installed in the first antenna 15 and the second antenna 19 and respectively output a signal corresponding to one direction to a port.

Therefore, a signal transmitted to the first antenna by the transmission circuit 11 is transmitted to the transmitted VSWR measurer 30 through a path of (b), and a power signal which is not output to the first antenna but is reflected is transmitted to the transmitted VSWR measurer 30 through a path of (a). Therefore, the VSWR of the transmit antenna is calculated by Math FIG. 1 by using power signals of the incident wave and the reflected wave.

The received VSWR measurer 40 includes a power signal receiver 41 and a power signal output unit 42. A test signal generated by the power signal output unit 42 is passed through a path of (d) having passed through the directional coupler 22 to the power signal receiver 41. A test signal generated by the received VSWR measurer 40 and reflected on the second antenna 19 is transmitted to the power signal receiver 41 through a path of (c). The power signal receiver 41 receives the power signals provided through the paths of (d) and (c), and a processor in the received VSWR measurer 40 uses the power signals to calculate a received VSWR.

As described, the prior art uses an additional VSWR measurer to obtain signal information on the progressive wave and the reflected wave used for the VSWR. However, it is needed to consider length and substance of a repeater feeder of a base station and a level of an output signal in order to produce an accurate VSWR. Also, it is inevitable that VSWRs must be measured multiple times since a level of the output signal is steeply varied depending on a call state while the base station provides a service. Hence, it is required for the VSWR measurer to include an additional memory and a central processing unit for measuring the VSWR multiple times and amending the same according to characteristics of the base stations.

Further, it is required for a user to visit each base station to be measured and test the same when the conventional VSWR measurer is used. In addition, a large amount of cost is generated for installing a VSWR measurer in each base station, integrated management in consideration of the characteristics of the base station is difficult, and it is impossible to determine the antenna's status in real-time.

DISCLOSURE OF INVENTION

Technical Problem

It is an advantage of the present invention to provide a system and method for reducing efforts and maintenance fees caused by undesired antenna tests.

It is another advantage of the present invention to provide a system and method for remotely monitoring antenna systems of a base station and a repeater and managing the same in a combined manner.

Technical Solution

In one aspect of the present invention, an antenna system monitor of a base station comprises: a radio communication module for receiving radio data including a first measurement value and a second measurement value of the antenna of the base station; a message parser for parsing the radio data to parse a base station identifier and measurement information; a base station information database for storing identifiers of a base station to be monitored, and status information of the base stations; a base station monitor for using the first and second measurement values to calculate factors of the base stations; and a measured result modifier for using status information of the base station information database corresponding to the base station identifier and modifying the calculated factors.

The first measurement value is a power of a progressive wave and the second measurement value is a power of a reflected wave.

In another aspect of the present invention, an antenna system measurer comprises: a first measurer for measuring a first measurement value of the antenna system; a second measurer for measuring a second measurement value of the antenna system; a radio data module for transmitting the first measurement value and the second measurement value in a radio data format; and a controller for controlling a number of measurement times of the first measurement value and the second measurement value and radio data transmission.

The first measurement value is a power of a progressive wave, and the second measurement value is a power of a reflected wave.

BRIEF DESCRIPTION OF THE DRAWINGS

The accompanying drawings, which are incorporated in and constitute a part of the specification, illustrate an embodiment of the invention, and, together with the description, serve to explain the principles of the invention.

BEST MODE FOR CARRYING OUT THE INVENTION

Figure 1:
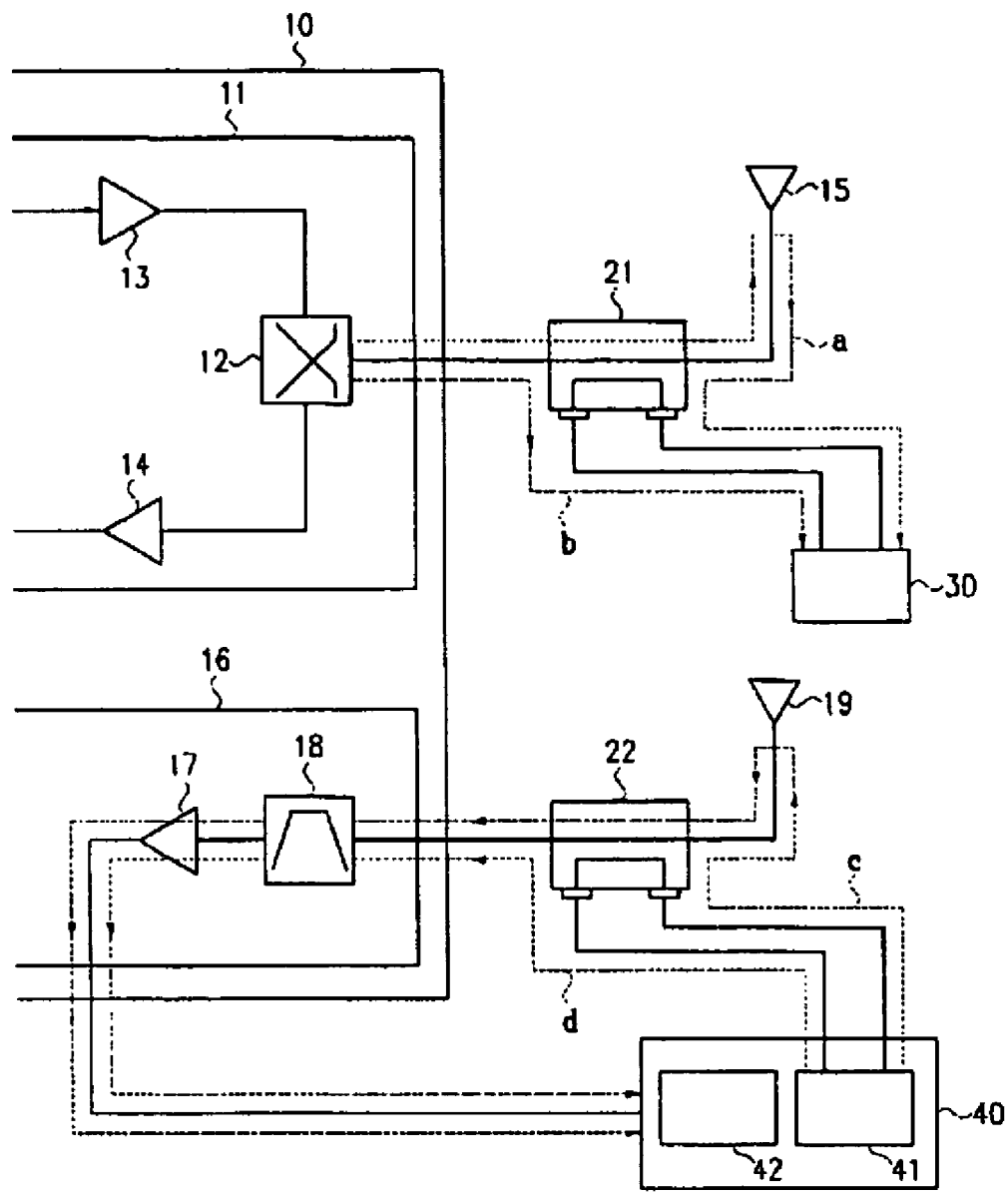
FIG. 1 shows a block diagram of a conventional VSWR measuring system.

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. To clarify the present invention, parts which are not described in the specification are omitted, and parts for which same descriptions are provided have the same reference numerals.

A device and method for remotely measuring an antenna system according to a preferred embodiment of the present invention will be described.

Figure 2:
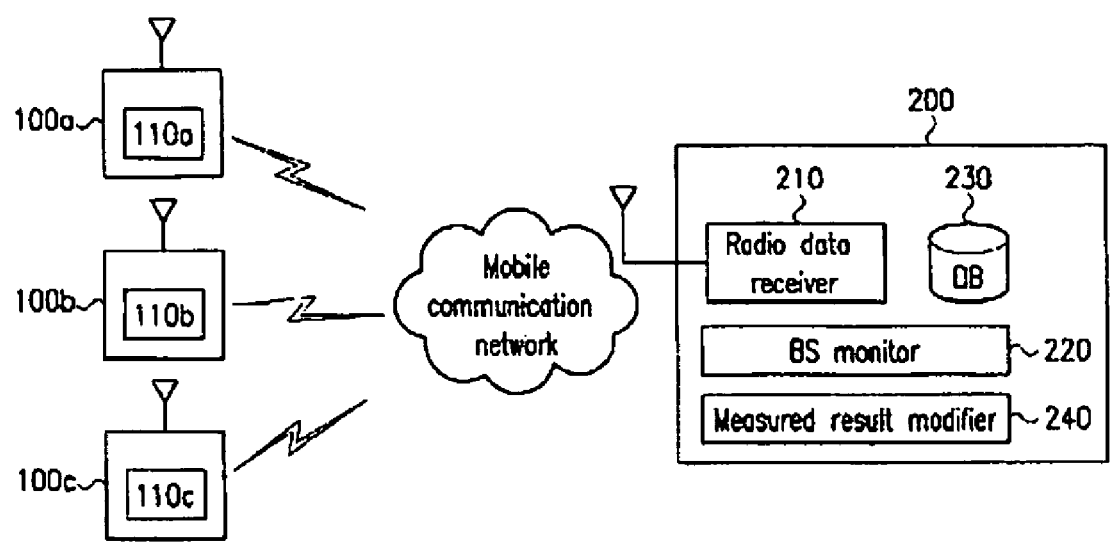
FIG. 2 shows a system for remotely measuring and monitoring an antenna system according to a preferred embodiment of the present invention.

FIG. 2 shows a system for remotely measuring and monitoring an antenna system according to a preferred embodiment of the present invention.

The system includes a plurality of base stations and repeaters 100a, 100b, and 100c, and a monitoring server 200 for monitoring antenna systems of the base stations and repeaters.

The base stations and repeaters 100a, 100b, and 100c having antenna systems include directional couplers, and measure a first power signal and a second power signal corresponding to a progressive wave and a reflected wave. The measured first power signal and second power signal are transmitted to the monitoring server 200 by a radio data module including a short message service (SMS) module installed in a measurer of each base station. Formats of the SMS and packet type radio data follow general mobile stations' data communication methods.

The radio data module advantageously allows usage of radio resources and facilities used by a mobile communication service provider and transmission of sufficient information (e.g., 80 bytes in the SMS case) with a lesser cost. Accordingly, antenna measurers 110a, 110b, 110c measure the first power signal and second power signal and easily transmit the measured values in a radio data format to the monitoring server, and the antenna system measurers 110a, 110b, 110c are simplified compared to the prior art.

The measured first power signal and second power signal transmitted by radio data through the mobile communication network are provided to a radio data receiver 210 of the monitoring server 200 including a base station information database 230 for classifying and storing information on the base stations and repeaters controlled by the monitoring server 200.

A base station monitor 220 receives detailed information on the antenna system of the base station from the base station information database 230, and uses the measured first power signal and second power signal to calculate a VSWR.

The measured result modifier 240 uses deviation between the first power signal and second power signal transmitted by the radio data or a modification value stored in the base station information database 230 and modifies the calculated VSWR.

Hence, the antenna systems of remote scattered base stations are efficiently managed with considerably less radio resources, and are monitored in real-time in consideration of facilities of the base stations.

A detailed configuration of respective components of FIG. 2 will now be described.

Figure 3:
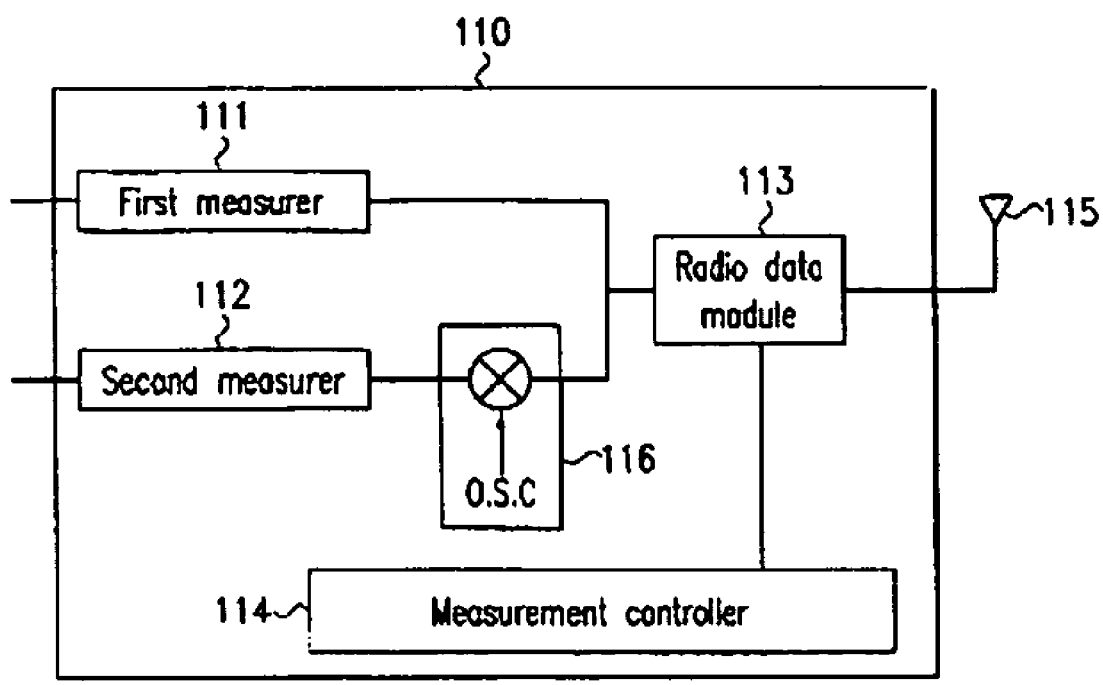
FIG. 3 shows a block diagram of an antenna system measurer according to a preferred embodiment of the present invention.

FIG. 3 shows a block diagram of an antenna system measurer according to a preferred embodiment of the present invention.

An antenna system measurer 110 includes a first measurer 111 for measuring values of progressive waves of the transmit antenna and the receive antenna, a second measurer 112 for measuring values of reflected waves of the antennas, a radio data module 113, a measurement controller 114, an antenna 115, and a frequency converter 116. In this instance, the first measurer 111 or the second measurer 112 may also be substituted for the antenna 115 depending on the purpose of usage.

The measurement controller 114 controls the first measurer 111 and the second measurer 112 to measure power signals of the progressive wave and the reflected wave of antennas of the base station and the repeater for a predetermined time frame and for a predetermined number of times. The measured first power signal and second power signal are transmitted in the radio data format to the monitoring server through the radio data module which is used in the general mobile station to transmit radio data. The radio data include identifiers of the base stations and the repeaters, and are used to transmit measured results executed a predetermined number of times or transmit a measured result for each measurement process.

The antenna system measurer according to the embodiment does not calculate the VSWR and modify the measured values, but measures power signals of the progressive wave and the reflected wave and transmits the power signals through a radio data transmission method.

In the case of measuring a transmitted VSWR, the measurement controller 114 controls the frequency converter 116 to be not operated and measures the power signals of the progressive wave and the reflected wave and transmits the same according to a radio data transmission method.

In the case of measuring a received VSWR, when receiving a measurement instruction from the monitoring server, the radio data module 113 uses no additional signal generator but uses an output of the radio data module to transmit a predetermined output (e.g., the frequency range between 1,740 and 1,760 MHz) to the receive antenna. Part of the output is not radiated from the receive antenna but is returned thereto, and the same is measured by the second measurer 112.

Since a transmitted frequency bandwidth and a received frequency bandwidth are different in the case of the radio data module used for a mobile station, the measured value of the reflected wave is up-converted into a received frequency bandwidth (e.g., ranging between 1,840 and 1,860 MHz) of the radio data module by the frequency converter 116 which is controlled by the controller 114 according to instructions by the monitoring server. The output of the radio data module 113 and the second measured value which is converted into the frequency bandwidth and is readable by the radio data module 113 are transmitted to the monitoring server in the radio data format such as an SMS.

Therefore, no additional signal generator for measuring the received VSWR is used, the output of the radio data module 113 is used to generate test signals, the test signals are converted into signals of a predetermined frequency bandwidth to be received by the radio data module, and the converted signals are reported to the monitoring server.

Figure 4:
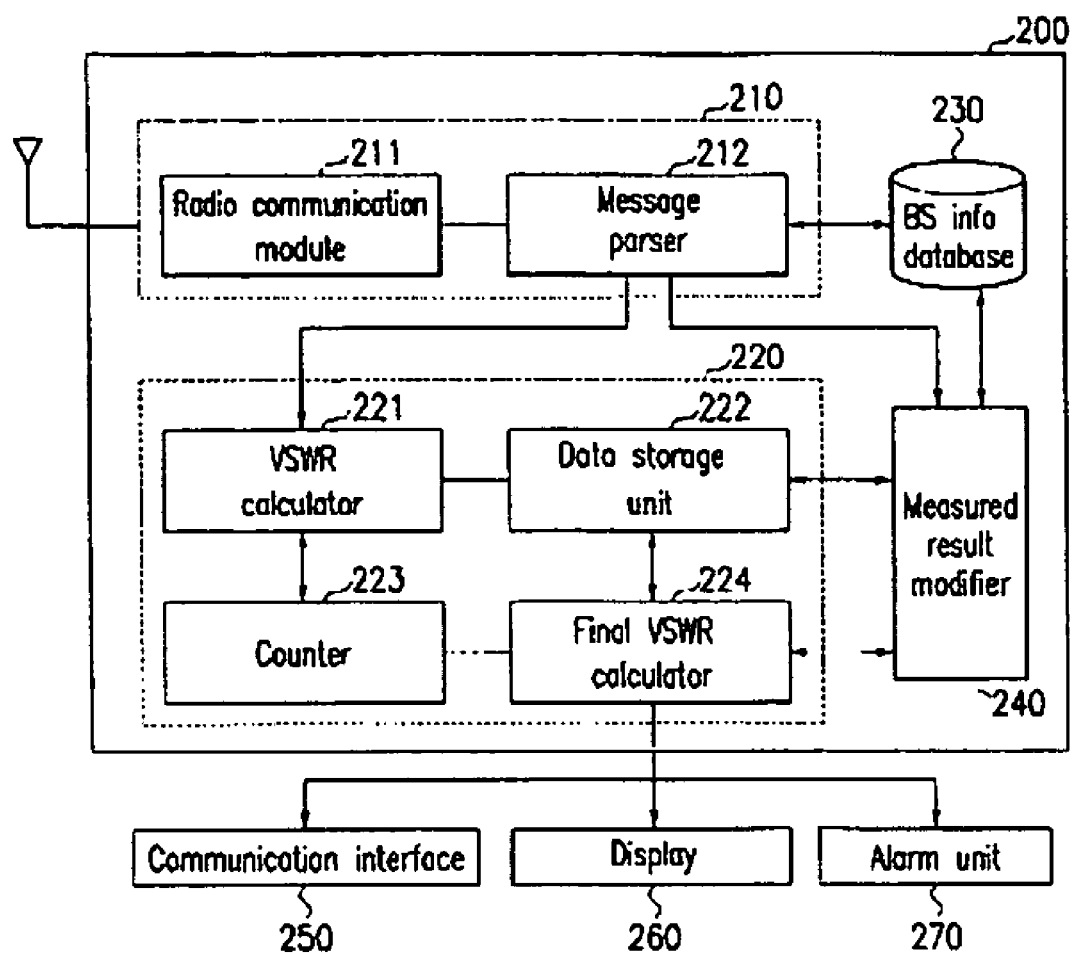
FIG. 4 shows a block diagram of a monitoring server according to a preferred embodiment of the present invention.

FIG. 4 shows a block diagram of a monitoring server according to a preferred embodiment of the present invention.

As shown, the monitoring server 200 includes a radio data receiver 210, a base station monitor 220, a base station information database 230, and a measured result modifier 240.

The radio data receiver 210 includes a radio communication module 211 for receiving radio data messages, and a message parser 212. The message parser 212 parses radio data messages to identify transmission base stations and separate the messages into a measurement time, a measurement time frame, a first measurement value, and a second measurement value, and provides separated data to the base station information database 230, the base station monitor 220, and the measured result modifier 240. The radio communication module wirelessly transmits measurement instructions to a predetermined base station.

The base station information database 230 stores information on modified measurement values, VSWRS, and measured values transmitted by the message parser 212.

The base station monitor 220 includes a VSWR calculator 221, a data storage unit 222, a counter 223, and a final VSWR calculator 224. The base station monitor 220 can be configured to be coupled to or combined with a communication interface 250 for data communication with external devices, a display 260, and an alarm unit 270 for alarming problems of the base station.

The VSWR calculator 221 uses measured values of the progressive wave and the reflected wave provided by the message parser 212 to calculate the VSWR. The VSWR is then temporarily stored in the data storage unit 222. The VSWRs calculated for a predefined number of times are transmitted to the final VSWR calculator 224 from the data storage unit 222 and a final VSWR is accordingly calculated.

The maximum and minimum data stored in the data storage unit 222 can be deleted by an instruction of the measured result modifier 240, and in addition, and data which are greater than a predetermined threshold value can be deleted, which are easily controlled by a skilled person in the art.

The final VSWR calculator 224 assigns a weight to an average and a specific value (e.g., a value corresponding to the VSWR repeated for a predetermined number of times) of data from which the minimum or maximum value is removed by the measured result modifier 240, and outputs an average of the weighted values.

Further, the measured result modifier 240 refers to the base station information database 230 to search for modification factors in consideration of feeders and substance of the base station, and reports searched results to the final VSWR calculator 224 so that the final VSWR calculator 224 may increase or reduce the average or weighted average with a modification rate.

The VSWR calculated by the final VSWR calculator 224 is used to provide visual information to an operator through the display 260, and is used to generate an alarm through the alarm unit 270 when the VSWR is greater than a predetermined threshold value.

Also, the final VSWR calculator 224 transmits the VSWR to the external devices through the communication interface 250 or stores the same in the database per data and time so that the VSWR may be utilized as data for managing the antenna systems of the base stations.

Figure 5:
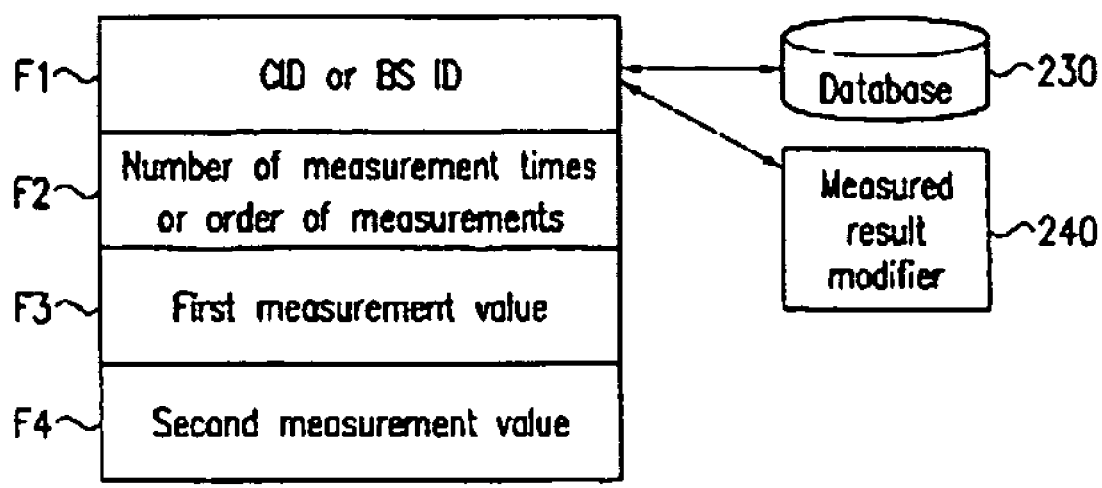
FIG. 5 shows a configuration of a radio data message including antenna system information according to a preferred embodiment of the present invention.

FIG. 5 shows a configuration of a radio data message including antenna information according to a preferred embodiment of the present invention.

In the embodiment, a radio data message is used to transmit the status of the base station in the SMS format of 80 byte characters or numbers, and can also be encoded into digital binary information to be parsed by the message parser, and can then be transmitted.

As shown in FIG. 5, a radio data message can be transmitted by four fields. A field (F1) includes a transmitter's CID (connection identifier) and a base station identifier. A field for the general SMS rule can be used for the field (F1) and an additional field can also be allocated to the field (F1).

A field (F2) includes a number of measurement times and a measurement order of the base station status. When the number of measurement times is recorded for the calculation of VSWR caused by multiple measurements, and the measured values are allocated to a plurality of radio data messages and are then transmitted, it is possible to display to what transmission order the transmitted radio data message corresponds.

A field (P3) and a field (F4) respectively store a first measured value and a second measured value corresponding to the reflected wave and the progressive wave. A plurality of first measured values and second measured values can be transmitted concurrently, depending on the capacity of the values.

The fields F1, F2, F3, and F4 are identifiable by field IDs, which are modifiable by a person skilled in the art in various manners.

The message parser searches for information stored in the fields, and controls the CID and the base station identifier to be applied to the base station information database 230 and the measured result modifier 240.

Figure 6:
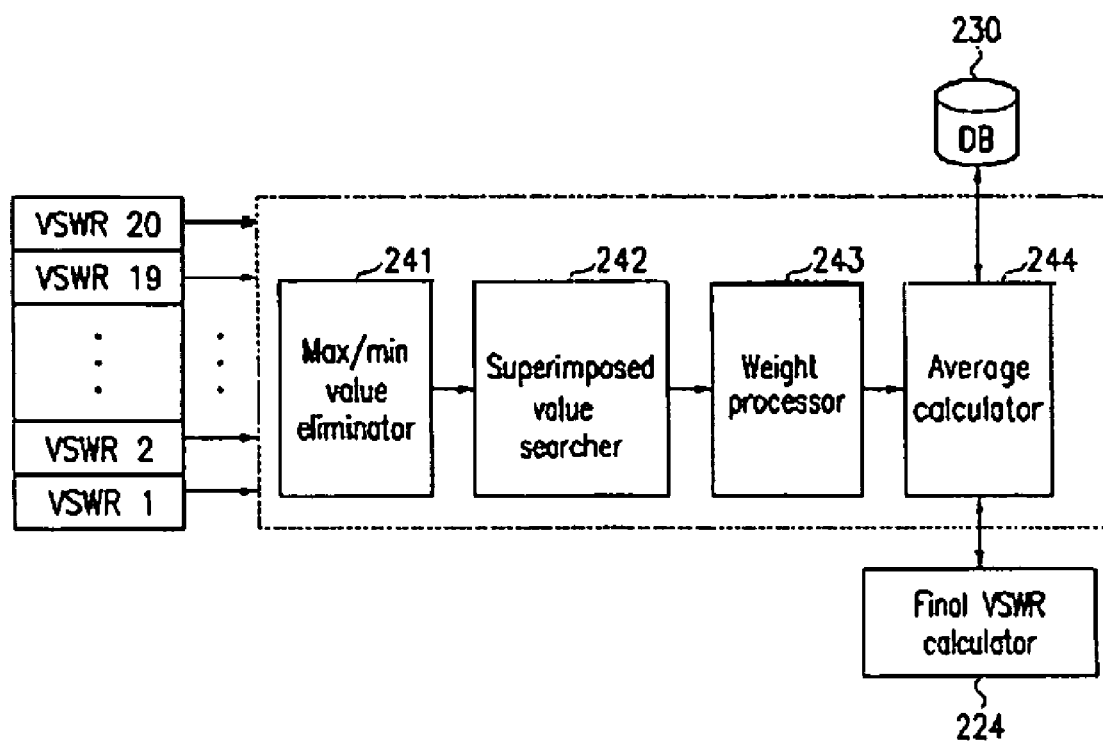
FIG. 6 shows a block diagram of a measured result modifier 240 according to a preferred embodiment of the present invention.

FIG. 6 shows a block diagram of the measured result modifier 240 according to a preferred embodiment of the present invention.

The measured result modifier 240 includes a maximum/minimum value eliminator 241, a superimposed value searcher 242, a weight processor 243, and an average calculator 244.

The maximum/minimum value eliminator 241 eliminates the maximum/minimum values of the VSWRs stored in the data storage unit 222, and in addition, establishes a predetermined threshold value and eliminates values which are greater than the threshold value because great deviations of the VSWR can be generated depending on the call states while the base station or the repeater provides services.

The superimposed value searcher 242 searches a VSWR which is superimposed or has an error less than a predetermined value from among the stored VSWRs, and controls the weight processor 243 to assign a weight.

The average calculator 244 calculates an average generated by providing the weight to measured data, and in addition, the average calculator 244 refers to the base station information database 230 to increase or reduce the calculated average with a predetermined rate and thereby modify the same.

The finally modified VSWR is transmitted to the final VSWR calculator 224 to be displayed to the operator or be used as management data.

The components of the measured result modifier 240 can be partially removed if needed, and can be installed in the base station monitor 220.

Figure 7:
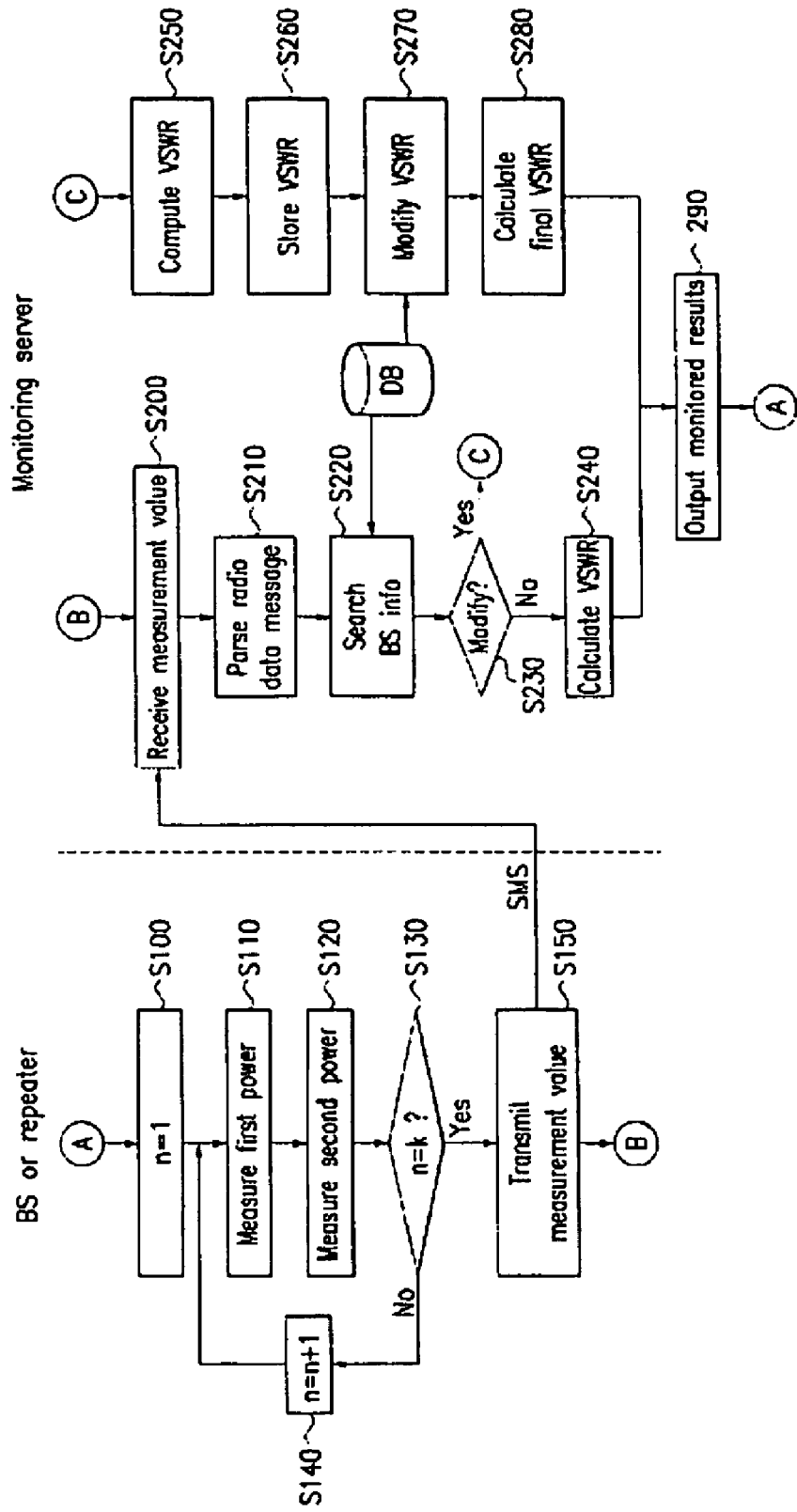
FIG. 7 shows a flowchart of a method for measuring and monitoring an antenna system of a base station according to a preferred embodiment of the present invention.

FIG. 7 shows a flowchart of a method for measuring and monitoring an antenna system of a base station according to a preferred embodiment of the present invention.

The base station or the repeater measures values of the progressive wave and the reflected wave of a transmit antenna or a receive antenna according to a predefined measurement rule. When the measurement process is started, the number of measurement times is initialized in Step S100.

In Steps S110 and S120, values of power signals of the progressive wave and the reflected wave are measured and stored by a measurer installed in the base station or the repeater. In Step S130, it is determined whether the measurement time has reached a predetermined number of measurement times, and when it is found to have reached the predetermined a number of measurement times, a radio data module is used to transmit measured results to the monitoring server in Step S150.

On receiving radio data, the monitoring server parses the message of the radio data to find sender information, the number of measurement times, the first measurement value, and the second measurement value in Steps S200 and S210.

The parsed sender information including a CID and a base station ID is used, and information of the base station information database is used to identify the base station and determine whether a modification is to be executed in Steps S220 and S230.

When no modification is needed, the VSWR is calculated and output according to the conventional VSWR calculation method in Steps S240 and S290.

When a modification is required according to the information recorded in the base station information database, a process for calculating the VSWR in consideration of the modified measured result is performed. The VSWR is computed by using the first measurement value and the second measurement value in Step S250, and, the computed VSWR is sequentially stored in an internal buffer or a memory in Step S260.

The stored VSWR values are modified with reference to modification information of the base station information database in Step S270. The above-noted VSWR modification can be discarded in the process of calculating the maximum/minimum VSWR in order to consider the call state, or the VSWR can be increased or reduced in consideration of the characteristics of the base station, such as feeders and substance.

When the modification is finished, the finally calculated VSWR is output in Step S280 so as to be used for base station monitoring information.

Therefore, a measurer and a radio data module of a mobile station are installed in the remotely scattered base stations or repeaters to thus easily monitor the base stations by using the existing radio resources.

Also, since there is no need to apply each characteristic of the base station to the measurer, the above-noted base station measurer's compatibility is improved and production cost is saved. Further, the monitoring server for calculating the VSWR depending on the measurement values can monitor the base stations in consideration of characteristics of the base stations in an integrated manner, and monitor the remote base stations in real-time without visiting the same.

The embodiment has been described with main reference to the VSWR, and it is obvious to a person skilled in the art that the embodiment can also be applied to a system for measuring and monitoring antenna estimation factors (e.g., a receive sensitivity) in consideration of modifications caused by a plurality of measurement values and the characteristics of base stations.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

According to the present invention, the antenna systems of base stations are measured and monitored in a combined manner and in real-time by using a base station measurer which allows usage of the existing radio resources, is highly compatible, and allows mass-production. Therefore, the present invention reduces conventional remote visitation and installation fees, and efficiently measures and monitors the antenna systems of the base stations.

The invention claimed is:

1. An antenna system monitor of a base station, comprising:
   a radio communication module for receiving radio data including a first measurement value and a second measurement value of the antenna system of the base station;
   a message parser for parsing the radio data to parse a base station identifier and measurement information;
   a base station information database for storing identifiers of base stations to be monitored, and status information of the base stations;
   a base station monitor for using the first and second measurement values to calculate factors of the base stations; and
   a measured result modifier for using status information of the base station information database corresponding to the base station identifier and modifying the calculated factors, wherein the measured result modifier comprises:
   a eliminator for eliminating a maximum value and a minimum value from among stored voltage standing wave ratios (VSWRs);

an average calculator for calculating a calculated average VSWR that is an average of the VSWRs;

a superimposed value searcher for searching for a superimposed value from among the VSWRs; and a weight assignor for assigning a weight to a maximum superimposed value according to a result provided by the superimposed value searcher.

2. The antenna system monitor of claim 1, wherein the first measurement value is a power of a progressive wave and the second measurement value is a power of a reflected wave.

3. The antenna system monitor of claim 2, wherein the factor of the base station includes a transmitted voltage standing wave ratio and a received voltage standing wave ratio (VSWR).

4. The antenna system monitor of claim 3, wherein the radio data include at least one first measurement value and at least one second measurement value, information on a number of measurement times, information on an order of measurements, and a caller number.

5. The antenna system monitor of claim 4, wherein the base station monitor comprises:

a VSWR calculator for using the at least one first measurement value and the at least one second measurement value to calculate a VSWR;

data storage unit for storing the calculated counter for controlling a calculation number of the VSWR; and final VSWR calculator for outputting a final VSWR by the measured result modifier.

6. The antenna system monitor of claim 1, wherein the measured result modifier uses base station information stored in the base station information database to increase or decrease the calculated averaged VSWR to thus perform modification.

7. The antenna system monitor of claim 1, further comprising:

a display for displaying a calculated final VSWR;

a communication interface for transmitting the calculated final VSWR to an external device; and an alarm unit for generating an alarm signal when the calculated final VSWR is greater than a predetermined threshold value.

8. A method for measuring and monitoring an antenna system of a base station in a mobile communication system, comprising:

using an antenna system measurer installed in a base station antenna and measuring a power of a progressive wave and a power of a reflected wave;

transmitting information including measurement values and measurement times of the progressive wave and the reflected wave and base station identifiers in a radio data format to a monitoring server;

allowing the monitoring server to receive the radio data, parse the message, and search information on the corresponding base station from a base station information database;

using the transmitted measurement values to calculate a voltage standing wave ratio (VSWR) of the base station, wherein calculating the VSWR includes:

calculating a plurality of calculated VSWRs;

eliminating a maximum value and a minimum value from among the calculated VSWRs; and calculating an average of the calculated VSWRs without the maximum value and the minimum value;

searching superimposed values from among the calculated VSWRs; and assigning a weight to a superimposed VSWR corresponding to the superimposed value; and modifying the VSWR according to searched base station information when modification is needed.

* * * * *